(12) United States Patent
Sharma et al.

(10) Patent No.: US 8,247,886 B1
(45) Date of Patent: Aug. 21, 2012

(54) POLARIZATION DIRECTION OF OPTICAL DEVICES USING SELECTED SPATIAL CONFIGURATIONS

(75) Inventors: Rajat Sharma, Goleta, CA (US); Eric M. Hall, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 219 days.

(21) Appl. No.: 12/720,593

(22) Filed: Mar. 9, 2010

Related U.S. Application Data

(60) Provisional application No. 61/158,622, filed on Mar. 9, 2009.

(51) Int. Cl.
*H01L 33/20* (2010.01)
*H01L 29/20* (2006.01)

(52) U.S. Cl. .. 257/620; 257/618; 257/613; 257/E33.006

(58) Field of Classification Search ................... 257/613, 257/618, 620, E33.006
See application file for complete search history.

(56) References Cited

U.S. PATENT DOCUMENTS

| 5,764,674 | A | 6/1998 | Hibbs-Brenner et al. |
| 6,501,154 | B2 | 12/2002 | Morita et al. |
| 6,639,925 | B2 | 10/2003 | Niwa et al. |
| 6,858,882 | B2 | 2/2005 | Tsuda et al. |
| 6,936,488 | B2 | 8/2005 | D'Evelyn et al. |
| 7,341,880 | B2 * | 3/2008 | Erchak et al. .................. 438/26 |
| 7,816,238 | B2 * | 10/2010 | Osada et al. .................. 438/503 |
| 2001/0048114 | A1 | 12/2001 | Morita et al. |
| 2002/0105986 | A1 | 8/2002 | Yamasaki |
| 2006/0213429 | A1 | 9/2006 | Motoki et al. |
| 2007/0054476 | A1 | 3/2007 | Nakahata et al. |
| 2008/0198881 | A1 | 8/2008 | Farrell et al. |
| 2008/0285609 | A1 | 11/2008 | Ohta et al. |
| 2008/0298409 | A1 | 12/2008 | Yamashita et al. |
| 2009/0065798 | A1 * | 3/2009 | Masui et al. .................... 257/99 |
| 2009/0072252 | A1 | 3/2009 | Son et al. |
| 2009/0095973 | A1 | 4/2009 | Tanaka et al. |
| 2009/0309110 | A1 | 12/2009 | Raring et al. |
| 2010/0001300 | A1 | 1/2010 | Raring et al. |
| 2010/0025656 | A1 | 2/2010 | Raring et al. |
| 2010/0148145 | A1 | 6/2010 | Ishibashi et al. |
| 2010/0219505 | A1 | 9/2010 | D'Evelyn |
| 2011/0056429 | A1 | 3/2011 | Raring et al. |

OTHER PUBLICATIONS

Farrell et al., 'Continuous-Wave Operation of AlGaN-Cladding-Free Nonpolar m-Plane InGaN/GaN Laser Diodes,' 2007, Japanese Journal of Applied Physics, vol. 46, No. 32, 2007, pp. L761-L763.

Feezell et al., 'AlGaN-Cladding-Free Nonpolar InGaN/GaN Laser Diodes,' Japanese Journal of Applied Physics, vol. 46, No. 13, 2007, pp. L284-L286.

Haskell et al., 'Defect Reduction in (1100) m-plane gallium nitride via lateral epitaxial overgrowth by hydride vapor phase epitaxy', Applied Physics Letters 86, 111917 (2005), pp. 1-3.

(Continued)

*Primary Examiner* — Evan Pert

(74) *Attorney, Agent, or Firm* — Kilpatrick Townsend & Stockton LLP

(57) ABSTRACT

A GaN based light emitting diode device which emits polarized light or light of various degrees of polarization for use in the creation of optical devices. The die are cut to different shapes, or contain some indicia that are used to represent the configuration of the weak dipole plane and the strong dipole plane. This allows for the more efficient manufacturing of such light emitting diode based optical devices.

13 Claims, 8 Drawing Sheets

OTHER PUBLICATIONS

Kojima et al., 'Stimulated Emission at 474 nm From an InGaN Laser Diode Structure Grown on a (1122) GaN Substrate,' Applied Physics Letters, vol. 91, 2007, pp. 251107-251107-3.

Kubota et al., 'Temperature Dependence of Polarized Photoluminescence From Nonpolar m-Plane InGaN Multiple Quantum Wells for Blue Laser Diodes,' Applied Physics Letter, vol. 92, 2008, pp. 011920-1-011920-3.

PCT Communication Including Partial Search and Examination Report for PCT/US2011/41106, dated Oct. 4, 2011, 2 pages total.

International Search Report for PCT application PCT/US2011/41106 (Jan. 5, 2012).

Tsuda et al., 'Blue Laser Diodes Fabricated on m-Plane GaN Substrates,' Applied Physics Express, vol. 1, 2008, pp. 011104-1-011104-3.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

USPTO Office Action for U.S. Appl. No. 12/478,736 dated Feb. 7, 2012.

* cited by examiner

POLARIZATION DIRECTION OF OPTICAL DEVICES USING SELECTED SPATIAL CONFIGURATIONS

CROSS-REFERENCES TO RELATED APPLICATIONS

This application claims priority to U.S. Provisional Application No. 61/158,622, filed Mar. 9, 2009, commonly assigned, and incorporated by reference for all purpose herein.

BACKGROUND OF THE INVENTION

The present invention relates generally to lighting techniques. More specifically, embodiments of the invention include techniques for the more efficient fabrication and handling of optical devices on semipolar or nonpolar crystalline semiconductor materials. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue and green color range for blue and green LEDs. The blue colored LEDs led to innovations such as solid state white lighting, the blue laser diode, which in turn enabled the BluRay™ DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has led scientists and engineers to the term "green gap" to describe the unavailability of such green LED. In addition, the light emission efficiency of conventional GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although highly successful, solid state lighting techniques must be improved for full exploitation of their potential. These and other limitations may be described throughout the present specification and more particularly below.

From the above, it is seen that techniques for improving optical devices is highly desired.

BRIEF SUMMARY OF THE INVENTION

According to the present invention, optical techniques are provided. More specifically, embodiments of the invention include techniques for the more efficient fabrication, handling, and packaging of light emitting diode devices using gallium nitride containing materials. Merely by way of example, the invention can be applied to applications such as optoelectronic devices, and the like. Other applications that desire polarized emission include liquid crystal display ("LCD") backlighting, liquid crystal on silicon ("LCOS") lighting, selected applications of home and/or building lighting, medical applications, biological sampling, plant and algae growth, biofuels, microscopes, film and video (e.g., amusement, action, nature, in-door), multi-dimensional display or televisions, micro and/or pico displays, health and wellness, optical and/or data transmission/communication, security and safety, and others.

In a preferred embodiment, the present invention provides a light emitting diode device, commonly called an LED, e.g., single LED device, array of LEDs. The device has a GaN substrate comprising a shape including a width and a length, the width (W) and the length (L) being different in magnitude. The LED device is provided on the GaN substrate and configured to emit partially or fully polarized electromagnetic radiation. The polarized electromagnetic radiation comprises a weak dipole plane and a strong dipole plane, the weak dipole plane being orthogonal to the strong dipole plane, the strong dipole plane being parallel or perpendicular to the width of the GaN substrate.

In an alternative specific embodiment, the present invention provides a method for indicating a dipole configuration of an LED device provided on a GaN substrate. The method determines a dipole configuration of an LED device provided on a gallium nitride containing substrate, which is configured to emit electromagnetic radiation having a weak dipole plane and a strong dipole plane. In a specific embodiment, the method includes forming one or more indicia on the LED device or gallium nitride substrate to correlate either the weak dipole plane or the strong dipole plane to the one or more indicia. The method also includes spatially orienting the LED devices provided on a gallium nitride substrates using at least the one or more indicia on the LED device provided on a gallium nitride substrate.

In still other embodiments, the present invention provides an optical device, e.g., LED array. The device has two or more GaN substrates configured in a package. Each of the GaN substrates is characterized by a shape including a width and a length, the width (W) and the length (L) being different in magnitude. An LED device is provided on each of the GaN substrates. The LED device is configured to emit partially or fully polarized electromagnetic radiation. The polarized electromagnetic radiation comprises a weak dipole plane and a strong dipole plane. In a preferred embodiment, the length and width are characterized by an aspect ratio of 1.1, 1.2, 1.3, 1.4, 1.5 and greater, or can be slightly less in some embodiments.

In one or more embodiments of the present invention, a method is provided for determining the strong and weak dipole planes of an LED die on a bulk semi-polar or non-polar GaN substrate used for an optical device. Specifically the dies are cut with at least one side of the die being different in length or shape than other sides of the die, in order to serve as a marker indicating the strong and weak dipole planes of the bulk GaN substrate material.

In an alternative specific embodiment, the die is cut into a rectangular shape. The die is cut from the wafer in such a manner that either the side of shorter length or the side of longer length indicates the strong and weak dipole planes of the GaN substrate material.

In another specific embodiment of the present invention, one side of the die is cut at an angle such that the side is not perpendicular to opposing parallel sides of the die. Such side thereby serves as indicia representing the strong or weak dipole plane of the GaN substrate material.

In another specific embodiment of the present invention, the die can be cut into any shape that is used to distinguish configuration of the strong and weak dipole planes.

In an alternate embodiment of the present invention a mark or feature is made on either of the larger surface area faces of the die, serving as indicia representing the configuration of the strong and weak dipole planes of the GaN substrate material, upon which the LEDs are built upon.

In another set of embodiments of the present invention, the method of determining the configuration of the strong and weak dipole planes of the die is used when combined with multiple die in an optical device in order to maximize light intensity.

In an alternate embodiment of the present invention, the method of determining the configuration of the strong and weak dipole planes of the die is used when combined with multiple die in an optical device in order to create a device capable of simultaneously emitting light of varying intensity levels.

Benefits are achieved by the present invention over conventional techniques. In one or more embodiments, the present device and method can provide a spatial orientation that is easily detectable for handling and packaging of die having strong and/or weak dipole planes. In other embodiments, the present device and method can be achieved using conventional technologies of scribing, breaking, and/or sawing/singulating. Preferably, the shaped die can be configured along with other die to form an array configuration. The array configuration is characterized by a system efficiency that is often higher than conventional unpolarized LEDs using c-plane GaN substrates in applications, which desire polarized emission. Depending upon the embodiment, one or more of these benefits may be achieved. These and other benefits are further described throughout the present specification and more specifically below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
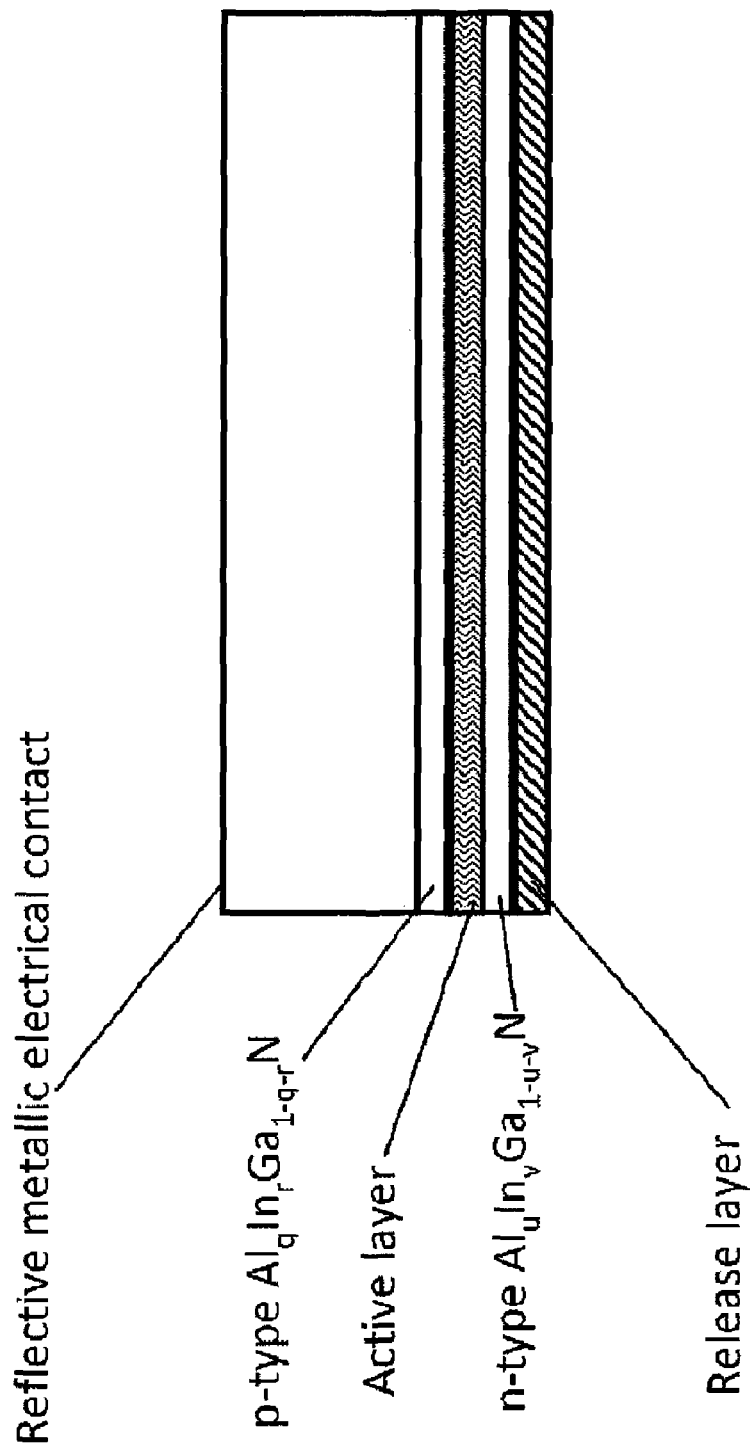
FIG. 1 shows a simplified diagram of a cross sectional view of a sample LED device structure fabricated on a bulk GaN substrate wafer according to an embodiment of the present invention.

According to the present invention, methods and devices for the more efficient fabrication of optical devices are provided. More specifically, methods and devices for determining the configuration of the strong and weak emission dipole planes of the die made from GaN materials are provided. Merely by way of example, the invention can be applied to applications such as optoelectronic devices, and the like. Other applications that desire polarized emission include liquid crystal display ("LCD") backlighting, liquid crystal on silicon ("LCOS") lighting, selected applications of home and/or building lighting, medical applications, biological sampling, plant and algae growth, biofuels, microscopes, film and video (e.g., amusement, action, nature, in-door), multi-dimensional display or televisions, micro and/or pico displays, health and wellness, optical and/or data transmission/communication, security and safety, and others.

While conventional optical devices have been fabricated on the c-plane of GaN substrates, researchers are exploring the properties of optical devices fabricated on m-plane GaN substrates. Specifically c-plane bulk GaN is polar, while m-plane bulk GaN is non-polar along the growth direction. LEDs fabricated on the m-plane of bulk GaN substrates can emit highly polarized light. By utilizing non-polar GaN substrate-based LEDs in applications which require polarized light (such as LCD back-lighting), improved system efficiencies can therefore be achieved. Furthermore, optical devices are also fabricated from GaN substrates wherein the largest area surface is angled from the polar c-plane leading to semipolar bulk GaN substrates. LEDs fabricated on bulk semipolar GaN substrates can also emit partially polarized light according to other embodiments. The degree of polarization of the emission can be related to the crystallographic orientation of the largest surface area of the bulk GaN substrate, the composition and constitution of the individual layers that make up the LED structure, the electrical current density at which the polarization ratio is measured, how the measurement occurs, among other factors. Regarding the measurement, complex equipment including selected polarizers, photodetectors, and handling techniques are often required to determine the degree of polarization. The use of non-polar or semi-polar GaN in the fabrication of LEDs allows for the creation of optical devices that produce light of various levels of polarization.

In order to maximize system efficiencies in end-applications for GaN LEDs with partially polarized emission, it is desirable in device manufacturing to know the orientations of the strong and weak emission dipole planes relative to largest surface area (or other surface area) of the LED chips fabricated from both non-polar and semi-polar bulk GaN substrates. As background information, non-polar and semi-polar bulk GaN substrates are available in wafer form, and are subsequently singulated into individual die following epitaxial growth and device wafer-level device fabrication. In wafer form, the orientations of the strong and weak dipole planes relative to the wafer's major and minor axes may be easily determined, by recording the emission intensity from an individual LED device with a polarizing optic placed between the device and a detector, for a sufficiently large number of angular orientations of the polarizing optic, as shown in FIG. 1A—the orientation of the strong emission dipole is then simply represented by the angular orientation of the polarizing optic at which the measured emission intensity is the strongest, with the weak emission dipole orientation being orthogonal to the strong emission dipole orientation. Typically, the LED devices are oriented relative to the substrate surface such that the orthogonal strong and weak dipole orientations are aligned to the edges of the individual LED chips. However, after singulation into individual LED die with typical square or similar geometries with high rotational symmetry, it can be extremely difficult, cumbersome, if not impossible, to keep track of the strong and weak dipole plane orientations for individual LED chips.

In order to maximize multi-LED system efficiency, the proper polarization field direction of individual die must often be easily determined during the packaging and assembly of the optical devices. In one or more embodiments, the strength of the dipole plane is related to a spatial feature of the individual die. In a specific embodiment, the spatial feature corresponding to either the strong or weak dipole of the individual die can be aligned in a desired configuration. In handling or packaging each individual die, it can be oriented along a preferred spatial orientation until the strong or weak dipole plane is aligned in a desired configuration in a specific embodiment. In alternative embodiments, the selected dipole can be aligned with a secondary optic, which can have a polarizing or non-polarizing property. In still other alternative embodiments, the selected dipole can be aligned with an Nth optic, where N is greater than 2 for general application. Of course, there can be other variations, modifications, and alternatives.

Figure 1A:
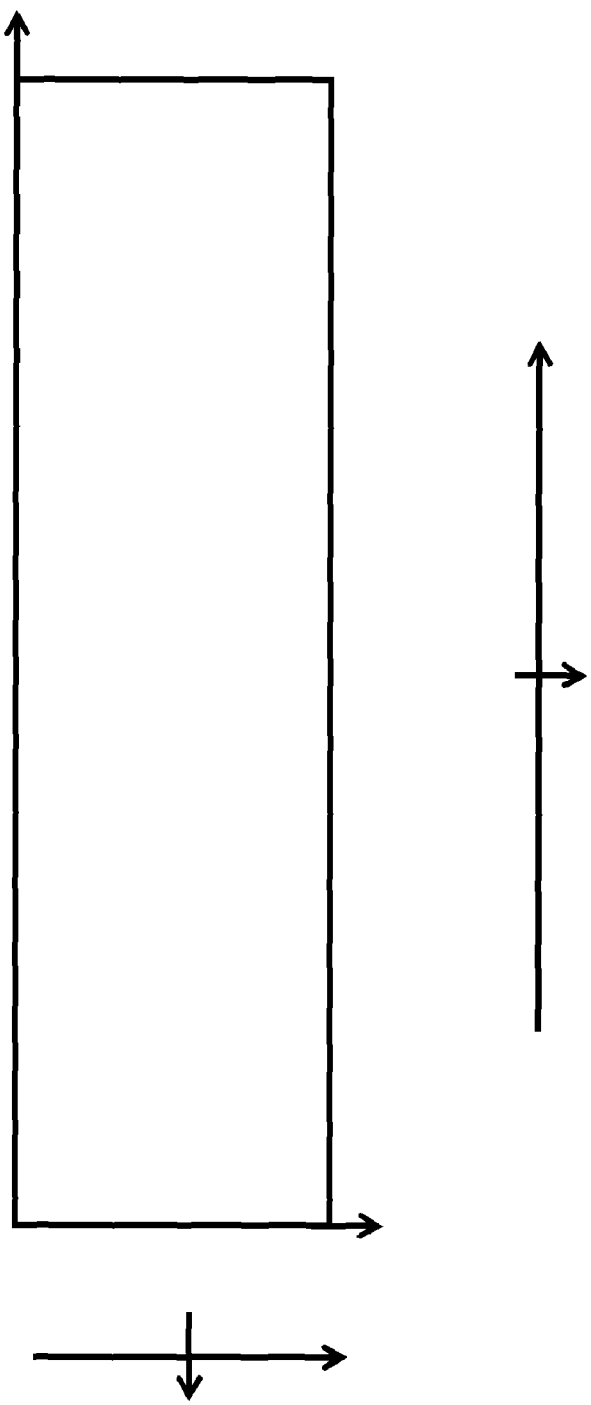
FIG. 1A is a simplified diagram illustrating one or more orientations of the strong and weak dipole planes relative to the wafer's major and minor axes by recording the emission intensity from an individual LED device with a polarizing optic placed between the device and a detector for a sufficiently large number of angular orientations of the polarizing optic.

FIG. 1 shows a sample LED device fabricated on a bulk GaN substrate wafer. This diagram is merely an example, which should not unduly limit the scope of the claims herein. One of ordinary skill in the art would recognize other variations, modifications, and alternatives. The substrate of the wafer includes a high quality nitride crystal with a release layer, as disclosed in U.S. Patent application 61/091,591, entitled, "Nitride crystal with release layer, method of making, and method of use," commonly assigned, and which is hereby incorporated by reference in its entirety. The nitride crystal comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In a preferred embodiment, the nitride crystal is substantially free of low-angle grain boundaries, or tilt boundaries, over a length scale of at least 3 millimeters. The nitride crystal has a release layer with an optical absorption coefficient greater than 1000 cm-1 at least one wavelength where the base crystal underlying the release layer is substantially transparent, with an optical absorption coefficient less than 50 cm-1, and may further comprise a high quality epitaxial layer, which also has a surface dislocation density below 105 cm-2. The release layer may be etched under conditions where the nitride base crystal and the high quality epitaxial layer are not.

The substrate may have a large-surface orientation within ten degrees, within five degrees, within two degrees, within one degree, within 0.5 degree, or within 0.2 degree of (0 0 0 1), (0 0 0 -1), {1 -1 0 0}, {1 1 -2 0}, {1 -1 0 ±1}, {1 -1 0±2}, {1 -1 0±3}, or {1 1 -2±2}. The substrate may have a dislocation density below $10^4$ cm$^{-2}$, below $10^3$ cm$^{-2}$, or below $10^2$ cm$^{-2}$. The nitride base crystal or wafer may have an optical absorption coefficient below 100 cm$^{-1}$, below 50 cm$^{-1}$ or below 5 cm$^{-1}$ at wavelengths between about 465 nm and about 700 nm. The nitride base crystal may have an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm.

In one or more embodiments, the device can be configured with an optional release layer. The release layer comprises heavily cobalt-doped GaN, has a high crystal quality, and is substantially black, with an optical absorption coefficient greater than 1000 cm$^{-1}$ or greater than 5000 cm$^{-1}$ across the visible spectrum, including the range between about 465 nm and about 700 nm. The release layer is between about 0.05 micron and about 50 microns thick and has a temperature stability approximately the same as the underlying base crystal and exhibits minimal strain with respect to the underlying base crystal.

An n-type $Al_uIn_vGa_{1-u-v}N$ layer, where $0 \leq u, v, u+v \leq 1$, is deposited on the substrate. The carrier concentration may lie in the range between about $10^{17}$ cm$^{-3}$ and $10^{20}$ cm$^{-3}$. The deposition may be performed using metal organic chemical vapor deposition (MOCVD) or molecular beam epitaxy (MBE).

Following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type layer. The well layers and barrier layers may each have a thickness between about 1 nm and about 20 nm. In another embodiment, the active layer comprises a double heterostructure, with an InGaN or $Al_wIn_xGa_{1-w-x}N$ layer about 20 nm to about 500 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

Next, a p-type doped $Al_qIn_rGa_{1-q-r}N$, where $0 \leq q, r, q+r \leq 1$, layer is deposited above the active layer. The p-type layer may be doped with Mg, to a level between about $10^{17}$ cm$^{-3}$ and $10^{21}$ cm$^{-3}$, and may have a thickness between about 5 nm and about 500 nm. The outermost 1-30 nm of the p-type layer may be doped more heavily than the rest of the layer, so as to enable an improved electrical contact.

A reflective electrical contact, with a reflectivity greater than about 70%, is then deposited on the p-type semiconductor layer or on the second n-type layer above a tunnel junction, if it is present. In another embodiment, the reflective electrical contact is placed on the n-type side of the device structure. In a preferred embodiment, the reflectivity of the reflective electrical contact is greater than 80% or greater than 90%. The reflective electrical contact may comprise at least one of silver, gold, aluminum, nickel, platinum, rhodium, palladium, chromium, or the like. The reflective electrical contact may be deposited by thermal evaporation, electron beam evaporation, sputtering, or another suitable technique. In a preferred embodiment, the reflective electrical contact serves as the p-type electrode for the textured-surface LED. In another embodiment, the reflective electrical contact serves as an n-type electrode for the textured-surface LED. Further details of the present invention are found throughout the present specification and more particularly below. Of course, there can be other variations, modifications, and alternatives.

Figure 2:
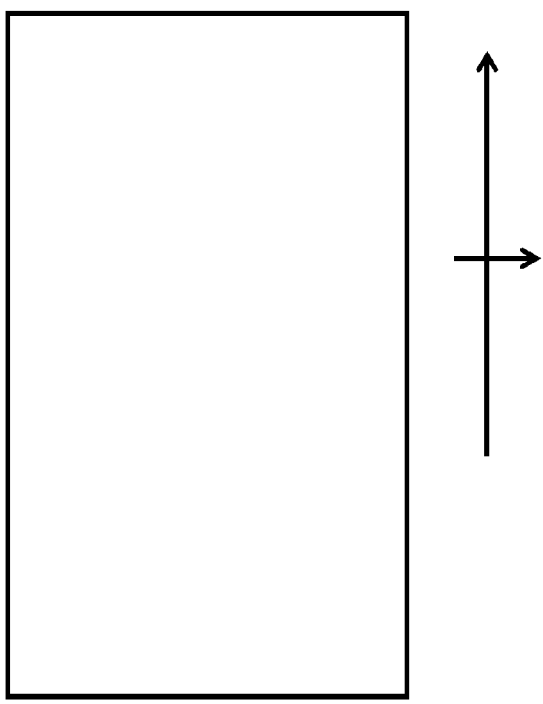
FIG. 2 shows a simplified diagram of a top view of a conventional square die including the configuration of the strong and weak dipole planes.

To further understand the present method and structures, FIG. 2 shows a top view of a conventional square shaped die with the configuration of the strong and weak dipole planes. After the LED structures of FIG. 1 are created on the bulk GaN substrate wafer, the wafer is then cut into individual die, typically in the shape of a square, which we discovered led to limitations in packaging and orienting the die in a desired manner. While the configuration of the strong and weak dipole planes of the bulk GaN substrate wafer may be known while the substrate is in wafer form, once the wafer has been processed and singulated to form a plurality of individual die including one or more optical devices, such planes are no longer known by visual inspection of the individual square dice. As a result, in order to determine the polarization field direction, a person must often manually tests and reorient in a trial and error basis each die in order to determine the configuration of the strong and weak dipole planes. Accordingly, conventional square shaped die have limitations in handling and lead to inefficiencies in packaging and the like.

Figure 3:
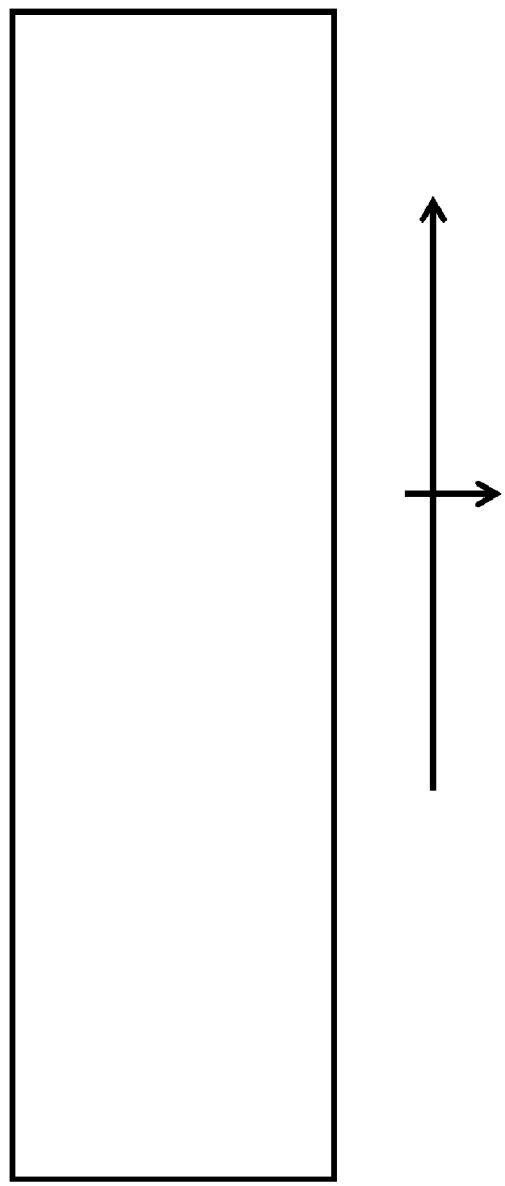
FIG. 3 shows a simplified diagram of a top view of a rectangular cut die used to indicate the configuration of the strong and weak dipole planes.

FIG. 3 shows a top view of a rectangular die of the present invention with the configuration of the strong and weak dipole planes according to an embodiment of the present invention. Cutting the die from the wafer in a rectangular shape provides a visible configuration that can represent the configuration of such planes. Specifically, since the configuration of the strong and weak dipole planes of the wafer is known, all of the die can be cut in a rectangular shape such that the longer side of the rectangle indicates the configuration of the strong and weak dipole planes. Alternatively, the die can be cut in a rectangular shape such that the shorter side indicates the configuration of such planes. Regardless of which side is used to represent the configuration of the strong and weak dipole planes, upon removal from the wafer, such configuration is known by visual inspection. This allows a user to quickly determine what the dipole plane configuration is and thereby more efficiently create optical devices using the die for purposes of handling and packaging. Of course, there can be other variations, modifications, and alternatives.

Figure 4:
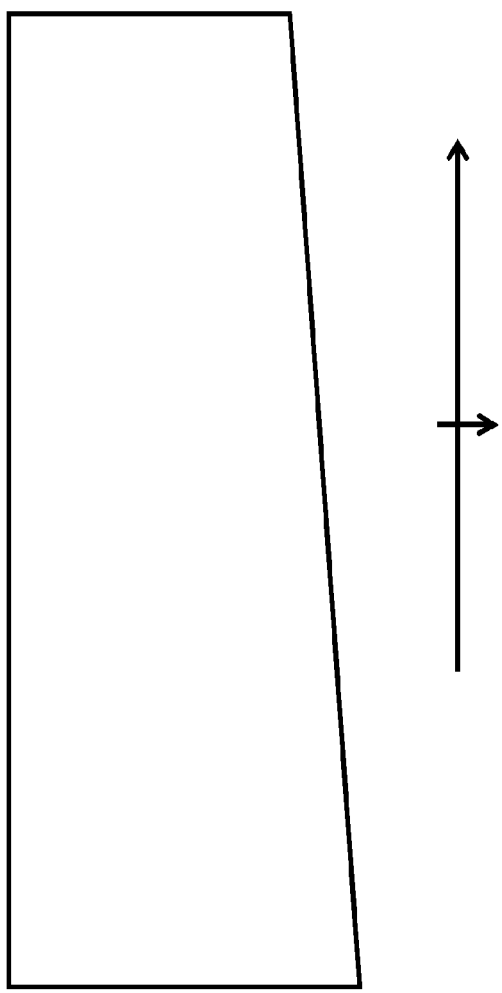
FIG. 4 shows a simplified diagram of a top view of a die with one side cut at an angle to indicate the configuration of the strong and weak dipole planes according to an embodiment of the present invention.

FIG. 4 shows a top view of a die of the present invention with one side cut at an angle and the configuration of the strong and weak dipole planes according to an embodiment of the present invention. Similar to the rectangular shape, alternatively, one side of the die can be cut at an angle when cutting the die from wafer, thereby providing a visible configuration that represents the configuration of the strong and weak dipole planes. In this embodiment of the invention, any side can be used to the dipole plane configuration. For example the angled side can be used, or the side opposing the angle side can be used to indicate the dipole planes. Likewise, the shorter of the parallel sides or the longer of the parallel sides can be used to indicate the dipole planes. Of course, there can be other variations, modifications, and alternatives.

In theory any non-square shaped die can be used as an indicator of the configuration of the strong and weak dipole planes of the individual die. All that is required is that each die is cut in the same configuration from the wafer so that the visual indication of the dipole planes remains constant amongst all of the die that are cut from the wafer. The shape of the die that is used to represent the dipole plane configuration is completely dependent on the fabrication process, and what shape is most effective and well suited for the resulting optical devices that are fabricated from such die.

Figure 5:
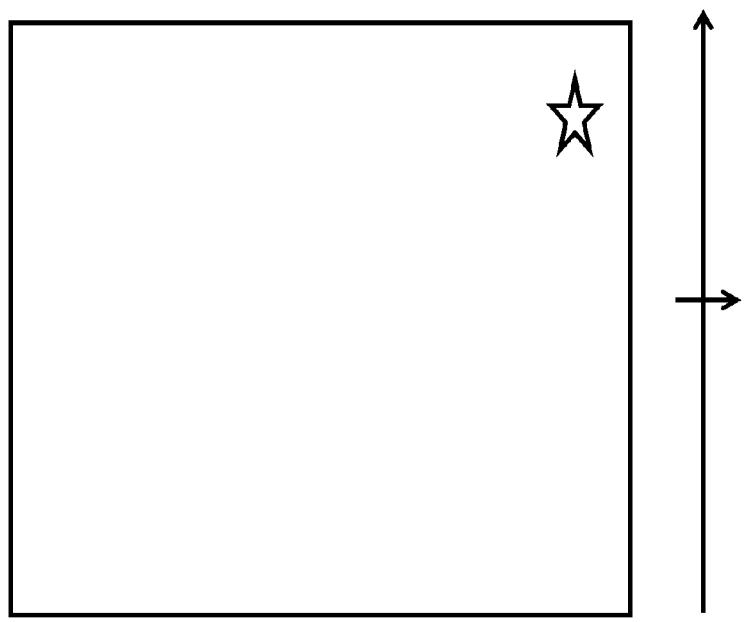
FIG. 5 shows a simplified diagram of a top view of a die with a mark used to indicate the configuration of the strong and weak dipole planes according to an embodiment of the present invention.

FIG. 5 shows a top view of a die with a mark that is used to indicate the configuration of the strong and weak dipole planes according to an embodiment of the present invention. The mark merely serves as indicia and can be of any shape, size, or design. The mark can be either permanent or non-permanent. A permanent mark can be created through any suitable means that does not create defects in the actual LEDs on the die, including but not limited to, lithography, milling, scribing, sawing, laser marking, masking, screen printing, chemical etching during the LED fabrication process. This mark can be placed on any side of any shaped die based on the preference of the manufacturer. In the shown embodiment a star is used to indicate the side of the die that is parallel to the strong dipole plane. Alternatively, a similar mark can be made on the back side of the die to ensure that the LED structure is not altered or damaged in any way. In a specific embodiment, the mark should be larger than about 10 microns, 100 microns, or greater, or large enough to be detectable by a machine reader (e.g., optical, capacitive, inductive, electrical, mechanical or any combination) or visual by a human being assisted with a microscope or under normal vision or other tool. Of course, there can be other variations, modifications, and alternatives.

Figure 6:
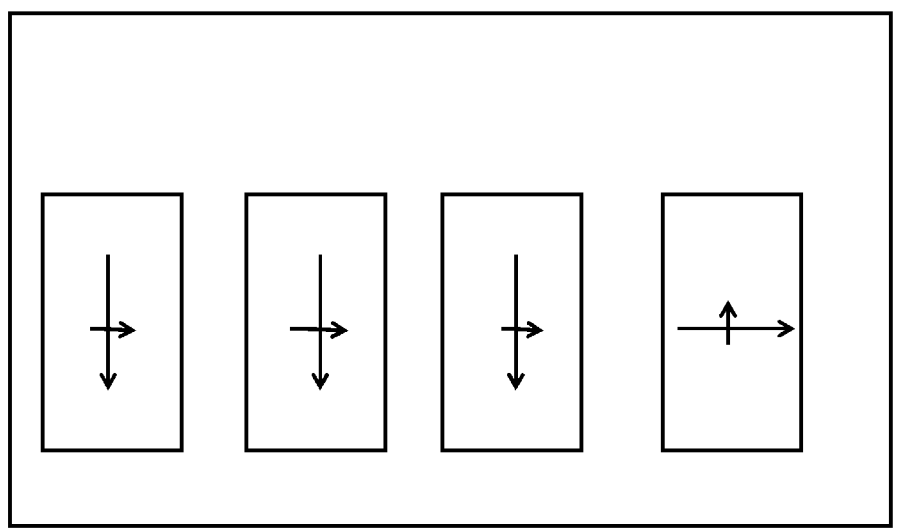
FIG. 6 shows a simplified diagram of a top view of an optical device created with multiple die wherein the configuration of the strong and weak dipole planes of the die are not aligned in the same direction according to an embodiment of the present invention.

FIG. 6 shows a top view of a sample optical device made from multiple die, wherein the configuration of the strong and weak dipole planes of each individual die are not aligned in the same direction according to an embodiment of the present invention. This can dramatically affect the performance of the device, as the light that is emitted from the misaligned die has a different direction of polarization, thereby decreasing the intensity of correctly polarized light that is emitted from the device. This is what creates the need for a method to quickly determine the configuration of the strong and weak dipole planes of the die. Of course, there can be other variations, modifications, and alternatives.

Figure 7:
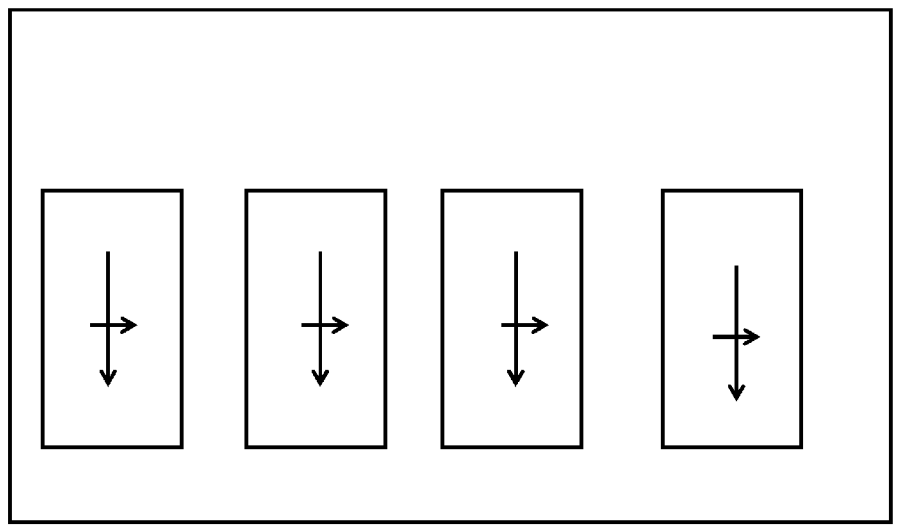
FIG. 7 shows a simplified diagram of a top view of an optical device created with multiple die wherein the configuration of the strong and weak dipole planes of the die are aligned in the same direction according to an embodiment of the present invention.

FIG. 7 shows a top view of a sample optical device made from multiple die, wherein the configuration of the strong and weak dipole planes of each individual die are aligned in the same direction according to an embodiment of the present invention. Using any of the embodiments of this invention, a user can ensure that when packaging multiple die to create an optical device, the die are positioned correctly such that the dipole planes are aligned along the same direction. This in turn ensures that all light is emitted along the same polarized field direction, thereby maximizing light intensity levels.

In some embodiments, at least one light emitting diode is packaged along with at least one phosphor, as described in U.S. patent application 61/086,139, entitled "White light devices using non-polar or semipolar gallium containing materials and phosphors," which is hereby incorporated by reference in its entirety. In other embodiments, at least one textured-surface light emitting diode is co-packaged along with at least one additional light emitting diode, as described in U.S. patent application 61/076,596, entitled "Copackaging configurations for nonpolar GaN and/or semipolar GaN LEDs," which is hereby incorporated by reference in its entirety. Thus, the present invention is not limited to the packaging of identical die fabricated from bulk GaN material. Instead, the present invention can be used with optical devices that utilize die fabricated from various materials. The present invention merely ensures that the manufacturer properly aligns the bulk GaN based die within the optical device.

While the above is a full description of the specific embodiments, various modifications, alternative constructions and equivalents may be used. Therefore, the above description and illustrations should not be taken as limiting the scope of the present invention which is defined by the appended claims.

The invention claimed is:

1. A light emitting diode device comprising:
a gallium-containing substrate comprising a shape including a width and a length, the width (W) and the length (L) being different in magnitude, wherein the shape is similar to a rectangular shape in which one side is cut at an angle; and
an LED device provided on the gallium-containing substrate and configured to emit partially or fully polarized electromagnetic radiation, the polarized electromagnetic radiation comprising a weak dipole plane and a strong dipole plane, the weak dipole plane being orthogonal to the strong dipole plane, the strong dipole plane being parallel or perpendicular to the width of the substrate.

2. The diode of claim 1 wherein the gallium-containing substrate comprises a semi-polar GaN substrate.

3. The diode of claim 1 wherein the gallium-containing substrate comprises a non-polar GaN substrate.

4. The diode of claim 1 wherein the length and the width are characterized by an aspect ratio (L/W) of 1.5 and greater.

5. The diode of claim 1 wherein the length and the width are characterized by an aspect ratio (L/W) of 2 and greater.

6. The diode of claim 1 wherein the gallium-containing substrate comprises a gallium species and a nitrogen species.

7. The diode of claim 1 wherein the LED device is formed on a semi-polar plane of the gallium-containing substrate.

8. The diode of claim 1 wherein the LED device is formed on a non-polar plane of the gallium-containing substrate.

9. The diode of claim 1 wherein the gallium-containing substrate is characterized by a wurtzite crystalline structure.

10. An optical device comprising:
two or more GaN substrates configured in a package, each of the GaN substrates characterized by a shape including a width and a length, the width (W) and the length (L) being different in magnitude, wherein the shape is similar to a rectangular shape in which one side is cut at an angle; and
an LED device provided on each of the GaN substrates, the LED device being configured to emit partially or fully polarized electromagnetic radiation, the polarized electromagnetic radiation comprising a weak dipole plane and a strong dipole plane, the weak dipole plane being orthogonal to the strong dipole plane, the strong dipole plane being parallel or perpendicular to the width of the GaN substrate.

11. The device of claim 10 wherein at least one of the GaN substrates comprises a semipolar GaN substrate.

12. The device of claim 10 wherein at least one of the GaN substrates comprises a non-polar GaN substrate.

13. The device of claim 10 wherein each of the LED devices is configured to emit the polarized electromagnetic radiation in a common direction.

* * * * *